United States Patent [19]

Coroy

[11] Patent Number: 5,410,145
[45] Date of Patent: Apr. 25, 1995

[54] LIGHT DETECTOR USING REVERSE BIASED PHOTODIODES WITH DARK CURRENT COMPENSATION

[76] Inventor: Trenton G. Coroy, 920 Reyton Blvd., Pickering, Ontario, Canada, L1W 1Y7

[21] Appl. No.: 202,127

[22] Filed: Feb. 25, 1994

[51] Int. Cl.$^6$ .............................................. H01J 40/14
[52] U.S. Cl. .................................. 250/214 C; 327/514
[58] Field of Search ................. 250/214 B, 551, 208.2, 250/214 C; 307/311, 278

[56] References Cited

U.S. PATENT DOCUMENTS

| | | | |
|---|---|---|---|
| 3,045,125 | 7/1962 | Mason | 250/214 C |
| 3,118,067 | 1/1964 | Mason . | |
| 3,723,013 | 3/1973 | Stirland et al. . | |
| 3,772,517 | 11/1973 | Smith . | |
| 4,227,155 | 10/1980 | Lerma . | |
| 4,356,393 | 10/1982 | Fayfield | 250/214 C |
| 4,714,827 | 12/1987 | Akita . | |
| 4,827,145 | 5/1989 | Arques . | |
| 4,916,307 | 4/1990 | Nishibe et al. . | |
| 4,979,045 | 12/1990 | Taniguchi et al. . | |
| 5,117,099 | 5/1992 | Schmidt . | |
| 5,182,448 | 1/1993 | Ohtsuka et al. . | |
| 5,214,275 | 5/1993 | Freeman et al. . | |
| 5,216,511 | 6/1993 | Tani . | |

Primary Examiner—Stephone B. Allen

[57] ABSTRACT

Light intensity detecting circuits using reverse biased photodiodes are disclosed. Two photodiodes are fabricated with essentially the same structure in close enough proximity to each other on a single semiconductor substrate so that they both experience the same environment. In one scheme the cathode of the first photodiode is common with the anode of the second photodiode and an inverting terminal of an operational amplifier with negative feedback. A negative voltage is applied to the anode of the first photodiode and a positive voltage of the same magnitude is applied to the cathode of the second photodiode. The output of the operational amplifier is proportional to the incident light provided the intensity on each photodiode are proportional to each other. In another circuit one of either the anodes or cathodes of each diode is common and the other is input into the inverting terminal of a separate operational amplifier. The outputs of each operational amplifier is input into a subtracter circuit to subtract common dark or photocurrent components so the output of the subtracter circuit is proportional to the difference in light incident on the photodiodes. The reverse bias across the photodiodes may be varied and this is of particular use for detectors whose spectral response may be shifted by means of, for instance the Franz-Keldysh or quantum confined Stark effects.

11 Claims, 3 Drawing Sheets

LIGHT DETECTOR USING REVERSE BIASED PHOTODIODES WITH DARK CURRENT COMPENSATION

FIELD OF THE INVENTION

The present invention relates to light intensity measuring devices using reverse biased photodiodes with dark current compensation.

BACKGROUND OF THE INVENTION

Diodes under reverse bias exhibit low reverse currents until Zener breakdown occurs. These reverse currents are alternatively referred to as leakage currents or dark currents because they are present in the absence of light. These dark currents are a strong function of temperature of the diode and are proportional to the area of the n-p junction.

When a photodiode under reverse bias is illuminated, the current is comprised of a dark current and photocurrent contribution. The photocurrent contribution is proportional to the amount of light absorbed by the diode while the dark current is approximately constant for fixed reverse bias voltage. In those situations where the photocurrents are greater than or of the same order of magnitude as the dark currents, and the latter are fixed, then it is a fairly simple matter to subtract out the constant dark current. However, correcting for dark currents becomes problematic when temperature induced dark current fluctuations become significant, when systems require modulation of reverse bias potentials or when the light induced photocurrents are small in comparison to the dark currents.

Known methods for nulling dark currents using reverse biased photodiodes under varying reverse bias requires a chopper and associated detection circuitry. This has limited development of systems which make use of photodiodes whose spectral response is alterable by varying the reverse bias such as those employing the Franz-Keldysh effect or quantum confined Stark effect.

Another drawback to many compensation schemes is that they require a reference diode that is completely optically shielded thereby imposing design constraints.

U.S. Pat. No. 5,182,448 (Ohtsuka et al.) discloses a photocoupler with suppressed noise characteristics comprising a pair of photodiode detectors each connected across the input terminals of an op-amp in such a way that the photodiodes cannot be reverse biased. Ohtsuka teaches that the photodiode which serves as reference must be completely shielded from light.

U.S. Pat. No. 5,117,099 (Schmidt) discloses an ambient light rejecting quad photodiode sensor array with unbiased sensor and reference photodiodes for compensation located outside the area of illumination. This arrangement does not allow for use of photodiodes under reverse bias.

U.S. Pat. No. 4,916,307 (Nishibe et al.) discloses a light detection circuit based on a charge storage optical sensor comprising a photodiode in parallel with capacitor, instead of the more common and simple current sensor approach. Nishibe teaches that the reference diode must be shielded from light in order to provide dark current compensation.

Accordingly, it would be advantageous to provide a simple, cost effective and reliable method of detecting light intensity using photodiodes under constant or varying reverse bias conditions which avoids the need for complicated detection circuitry and completely shielding one of the photodiodes.

SUMMARY OF THE INVENTION

The present invention provides a light detector circuit using reverse biased photodiodes configured to null common currents flowing through the photodiodes. The light intensity detecting circuit comprises first and second photodiodes having predetermined scale and structure. The photodiodes are integrally formed on a substrate in close enough proximity so that the first and second photodiodes experience substantially the same environment. Provided is a means for applying potentials to the first and second photodiodes to reverse bias the first and second photodiodes to produce a dark current in flowing through each photodiode. The scale and structure of the first and second photodiodes and the magnitude of the reverse bias applied across each photodiode are selected to produce substantially the same dark current flowing through each photodiode. The photodiodes are responsive to illumination to produce a photocurrent, wherein a total current flowing through each photodiode includes the dark current and the photocurrent. The first and second photodiodes are operably coupled to means for subtracting the total currents flowing through each photodiode to produce an output electrical signal substantially independent of dark current contributions, and proportional to the level of illumination incident on the photodiodes.

BRIEF DESCRIPTION OF THE DRAWINGS

The light intensity detecting circuits using photodiodes under reverse bias embodying the subject invention will now be described, by example only, reference being had to the accompanying drawings, in which.

DETAILED DESCRIPTION OF THE INVENTION

Figure 1:
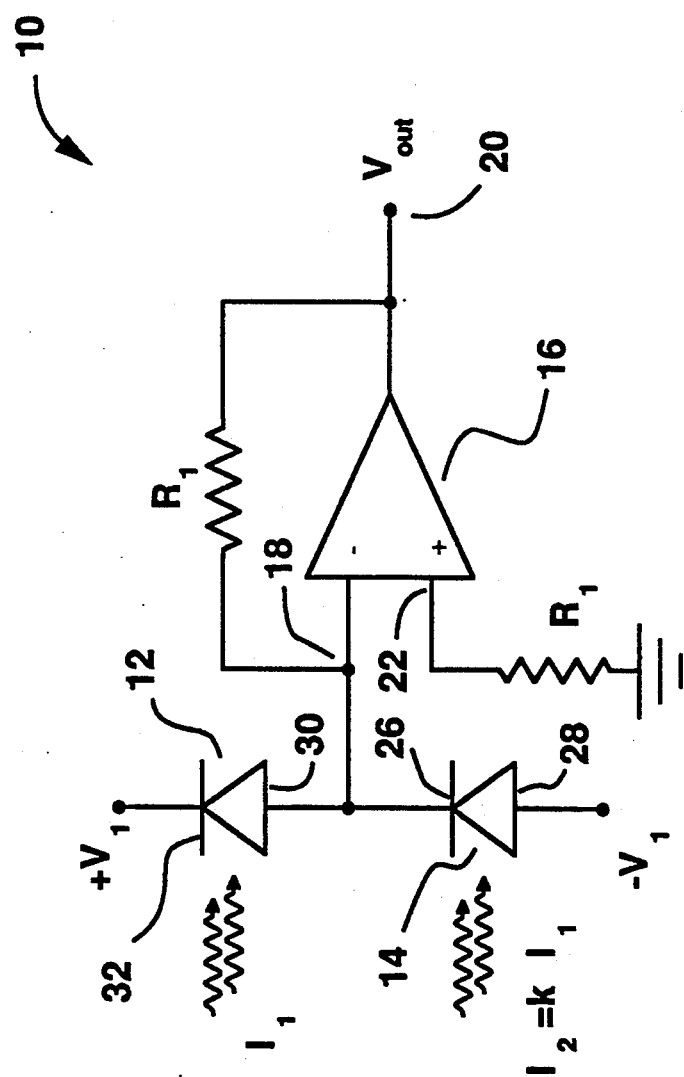
FIG. 1 is a schematic circuit diagram of a light intensity detecting circuit embodying the subject invention comprising two reverse biased photodiodes fabricated on a common substrate and interconnected with a subtraction circuit.

Referring first to FIG. 1, a light intensity detecting circuit is shown generally at 10. Circuit 10 includes a pair of photodiodes 12 and 14 manufactured as an integrated circuit on a single substrate (not shown). Photodiodes 12 and 14 are manufactured with substantially the same scale and structure so that they are substantially identical with respect to electronic characteristics and sensitivity to light. Photodiodes 12 and 14 are manufactured close enough to each other that each experiences substantially the same environmental conditions including temperature, pressure and other factors. Environmental conditions as used herein refers to those environmental factors which will have an effect on the electronic properties of the photodiodes.

Circuit 10 includes an operational amplifier 16 configured for negative feedback using a resistor $R_1$ from inverting terminal 18 to the output terminal 20. An identical resistor $R_1$ from the non-inverting terminal 22 to ground provides impedance balance to the op-amp. Cathode 26 of photodiode 14 is common with both anode 30 of photodiode 12 and inverting terminal 18 of operational amplifier 16. A negative voltage $-V_1$ is applied to anode 28 of photodiode 14 and the positive voltage $+V_1$ is applied to cathode 32 of photodiode 12.

In operation, photodiodes 12 and 14 are subject to the same reverse bias potential $V_1$ so that the same dark current flows through both. Inverting terminal 18 is held at virtual ground by op-amp 16, assuming negligible current flow through non-inverting terminal 22 of the op-amp. Thus the common current components (dark and photocurrents) flowing through both the photodiodes are cancelled out or are nulled so that they do not flow through resistor $R_1$ in the negative feedback loop. Consequently, when one of the photodiodes is illuminated with light of a different but proportional intensity ($I_2 = kI_1$) than impinging on the other photodiode ($I_1$), the output voltage $V_{out}$ appearing at output 20 of op-amp 16 will be proportional to the incident light intensity.

For applications where a variable reverse bias potential is preferred, the magnitude of $V_1$ for each photodiode 12, 14 may be varied within the reverse bias region so that the dark current through both photodiodes is increased or decreased by the same amount.

Circuit 10 may be fabricated on the substrate as a monolithic integrated circuit including photodiodes 12 and 14 and op-amp 16. Alternatively, photodiodes 12 and 14 may be fabricated as an integrated circuit discrete from the other components of the circuit.

Figure 2:
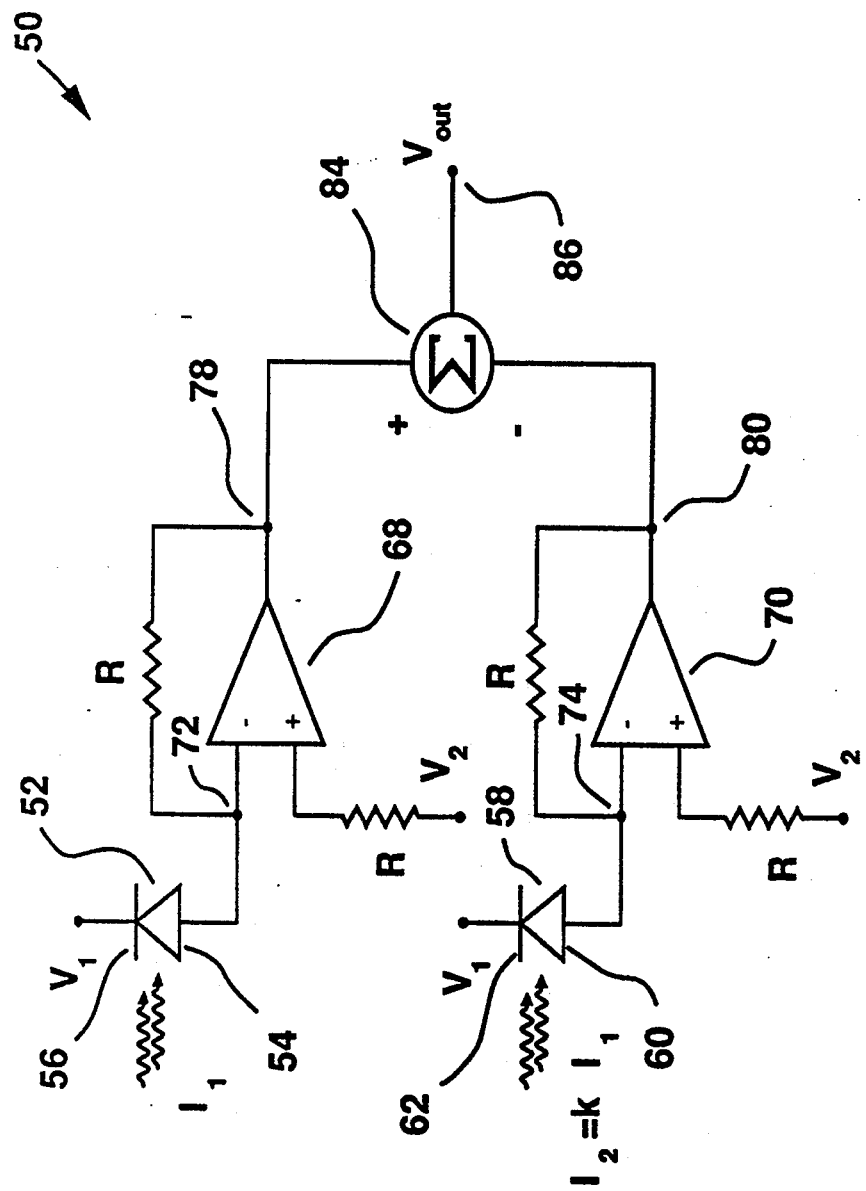
FIG. 2 is a schematic circuit diagram of an alternative embodiment of a light intensity detecting circuit in which the cathodes of each photodiode are connected to a common voltage, the anodes are connected to the inverting input of separate operational amplifiers used to convert current signals to voltage signals, and these respective voltage signals are subtracted by means of a voltage substraction circuit.

Referring to FIG. 2, another embodiment of a circuit constructed in accordance with the present invention is shown generally at 50. Circuit 50 comprises a photodiode 52 with anode 54 and cathode 56 and photodiode 58 with anode 60 and cathode 62. Two operational amplifiers 68 and 70 form part of circuit 50 with inverting terminal 72 of op-amp 68 common with anode 54 of photodiode 52. Anode 60 of photodiode 58 is common with inverting terminal 74 of op-amp 70. A resistor R between terminal 72 and output terminal 78 of op-amp 68 and a resistor between terminal 74 and output terminal 80 of op-amp 70 provide negative feedback for the op-amps. Resistors R located between the non-inverting terminals of op-amps 68 and 70 to voltage sources $V_2$ provide balanced impedances to the op-amp terminals. Voltage outputs 78 and 80 from outputs 68 and 70 are input into a subtracter circuit 84 which provides an output 86 that is the difference between voltage outputs 78 and 80.

In operation, photodiodes 52 and 58 are reverse biased by the same voltage $V_1-V_2$, where $V_1$ is applied to cathodes 56 and 62. Op-amps 68 and 70 convert the currents passing through photodiodes 52 and 58 to voltages which are input to subtracter circuit 84. The voltage output 86 of subtrator 84 is proportional to the light intensity incident on the photodiodes provided $I_2 = kI_1$ and the dark currents through the photodiodes are the same. The reverse bias potential on photodiodes 52 and 58 may be varied by changing either the common voltage $+V_1$ on cathodes 56, 62 of the photodiodes or by varying voltage $V_2$ on the non-inverting terminals of the operational amplifiers.

Photodiodes 52 and 58 are formed as an integrated circuit on a substrate in close enough proximity to each other that both experience the same environmental conditions. The remainder of circuit 50 may or may not be formed on the same substrate as an integrated circuit.

Figure 3:
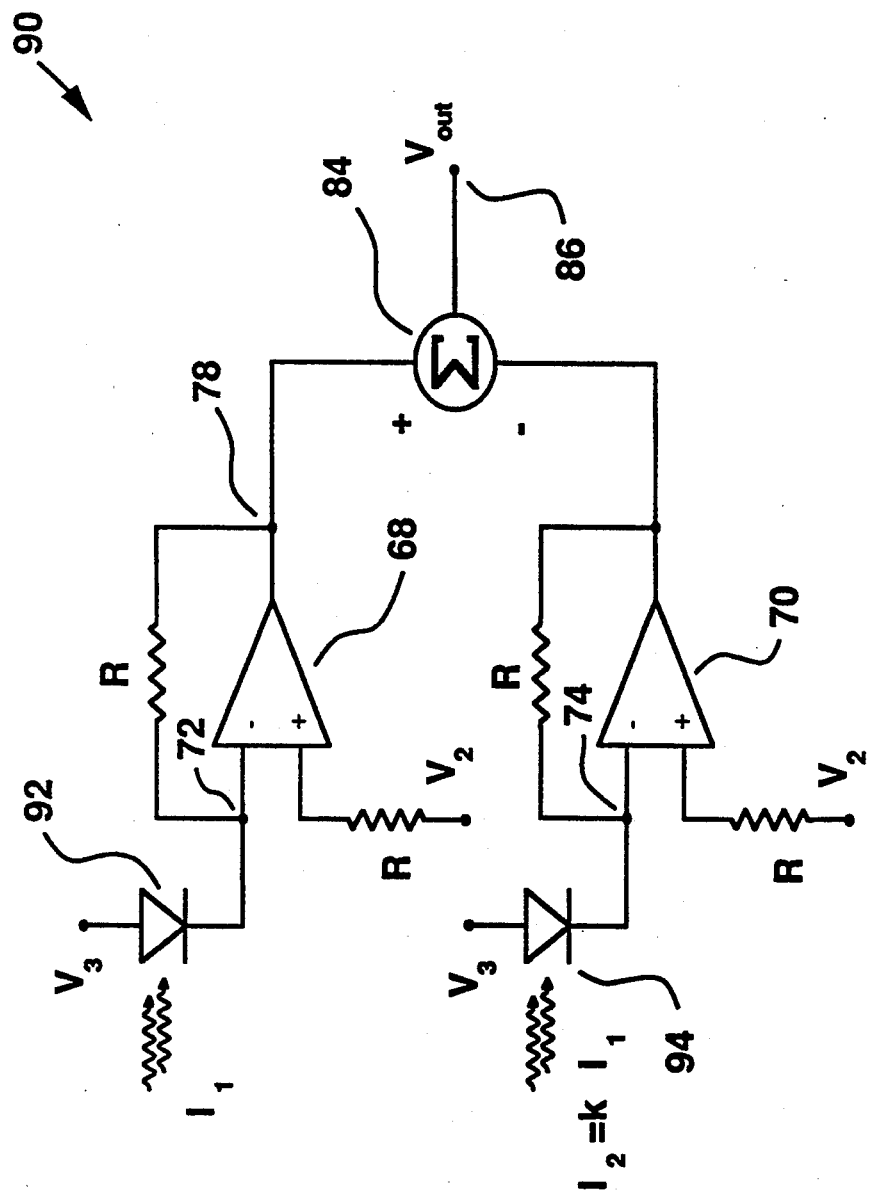
FIG. 3 is a schematic circuit diagram of a light intensity detecting circuit similar to FIG. 2 but with common anodes.

A circuit similar to circuit 50 is shown at 90 in FIG. 3 but wherein the anodes of photodiodes 92 and 94 are common and a bias voltage $V_2-V_3$ acts to reverse bias the photodiodes by the same amount. Circuit 90 otherwise operates in the same way as circuit 50.

Circuit 10 intrinsically nulls the common current components flowing through the photodiodes so that the difference, preferably due only to photocurrent, flows through the feedback loop to the op-amp output. In circuits 50 and 90 the output voltages of the op-amps, including dark and photocurrents, are subtracted by the subtracter circuits 84 to give a signal proportional to the photocurrents of the two photodiodes.

Since the photodiodes in circuits 10, 50 and 90 are operated under reverse bias, the circuits exhibit a higher responsiveness to incident light and a lower photodiode capacitance compared to unbiased photodiode detector schemes. Another advantage of these detector circuits is that there is no requirement that the photodiode acting as the reference be completely shielded from light. Both photodiodes may be illuminated but so long as there is a difference in light intensity incident upon the two photodiodes with the two intensities being proportional to each other, the output voltage $V_{out}$ of the detector circuit will be proportional to the amount of incident light.

In addition, the photodiodes are fabricated as part of an integrated circuit in close enough proximity to each other on the same substrate such that they both experience substantially the same environmental conditions. Therefore, those temperature and other environmental fluctuations which affect the dark current flowing through the two photodiodes will affect them both to the same or closely similar degree so that the resultant dark current increase or decrease is common to both photodiodes and is intrinsically nulled by the circuits. This is particularly advantageous when photocurrents are of the same order of magnitude or lower than the dark currents flowing through the photodiodes.

The required degree of separation of the two photodiodes will depend in part on the application for the detector. Higher sensitivity is achieved the closer the photodiodes are to each other since the probability increases that each will experience the same environment. Further, properties of the substrate, such as thermal conductivity, are also important in determining the separation of the photodiodes. The higher the thermal conductivity of the substrate, the farther apart the photodiodes may be fabricated since thermal fluctuations will be transmitted.

The light detecting circuits 10, 50 and 90 with reverse biased photodiodes may be used in applications which utilize the Franz-Keldysh effect when the photodiodes are bulk semiconductors. Alternatively, when the photodiodes are superlattices or other quantum confined structures such as quantum wells or quantum wires, the band edge may be shifted using the quantum confined Stark effect (QCSE). Variation of the reverse bias potential shifts the absorption edges of the photodiodes in both devices to longer wavelengths thereby altering the spectral sensitivity of the detector circuit. These bulk or quantum confined effects which may be used for absorption edge tuning cannot be exploited in photodiode detectors absent reverse biasing.

The reverse biased photodiode light detection system disclosed herein has been described using operational amplifiers in the subtraction circuit of FIG. 1 or to convert current to voltage before subtraction in FIGS. 2 and 3. Those skilled in the art will appreciate that numerous other circuits could be used to subtract the current signals of the two photodiodes to provide an output signal proportional to the incident light.

The incident light may be transmitted to either of the photodiodes using for example fiber optics or other waveguide technology. There is no requirement that one of the photodiodes be completely light shielded. This advantageously avoids fabrication problems associated with shielding one of the photodiodes when both are in close proximity.

The photodiodes have been described as being of the same scale and structure on the same substrate so that they have substantially the same sensitivity to light, and so that under the same reverse bias substantially the same electrical response such as dark currents flow. In an alternative configuration, the photodiodes may be fabricated of different scale or structure but with equivalent electrical function to give substantially the same or proportional dark currents. It is not a problem if the photodiodes have differing sensitivities to light. In this case, however, the condition that $I_1 \neq I_2$ used throughout the present application is no longer valid, and one must ensure that the photocurrents of the two photodiodes are not equal, as they would then cancel each other out in the subtraction used to null the dark currents.

Therefore, while the dark current compensating light detection system using reverse biased photodiodes has been described and illustrated with respect to the circuits disclosed herein, it will be appreciated by those skilled in the art that numerous variations of these circuits may be made without departing from the scope of the invention described herein.

I claim:

1. A light intensity detecting circuit, comprising;
   a) first and second photodiodes being integrally formed on a substrate in close enough proximity that said first and second photodiodes experience substantially the same environment, said first and second photodiodes having predetermined scale and structure; and
   b) means for applying a first potential across said first photodiode and a second potential across said second photodiode to reverse bias said first and second photodiodes thereby responsively producing a dark current flowing through each photodiode, the scale and structure of the photodiodes and the potentials being selected to produce substantially the same dark current flowing through each photodiode, said photodiodes being responsive to illumination to produce a photocurrent, wherein under illumination a total current flowing through each photodiode includes said dark current and said photocurrent, said first and second photodiodes being operably coupled to means for subtracting the total currents flowing through each photodiode to produce an output electrical signal related to the difference in said total currents.

2. The light intensity detecting circuit according to claim 1 wherein said first and second photodiodes are fabricated with substantially the same scale and structure, and wherein said first and second potentials applied across said photodiodes are substantially the same.

3. The light intensity detecting circuit according to claim 2 wherein said means for reverse biasing said at least two photodiodes and for subtracting currents flowing through said first and second reverse biased photodiodes comprises a cathode of said first photodiode being electrically connected to an anode of said second photodiode and to an inverting terminal of an operational amplifier with negative feedback and an output, and a negative voltage being applied to an anode of said first photodiode and a positive voltage being applied to a cathode of the second photodiode, wherein the negative and positive voltages are of substantially the same magnitude, and wherein the output of the operational amplifier is the subtracted currents.

4. The light intensity detecting circuit according to claim 2 wherein said means for reverse biasing said first and second photodiodes and for subtracting currents flowing through said first and second reverse biased photodiodes comprises an anode of said first photodiode being electrically connected to an inverting terminal of a first operational amplifier means, an anode of said second photodiode being electrically connected to an inverting terminal of a second operational amplifier means, and a voltage potential being applied between the cathodes of said first and second photodiodes and the noninverting inputs of the first and second operational amplifiers such that the first and second photodiodes are reverse biased, the first and second operational amplifier means having outputs connected to the respective inputs of a subtracting circuit, wherein the output of the subtracting circuit is proportional to the difference in currents flowing through said first and second photodiodes.

5. The light intensity detecting circuit according to claim 2 wherein said means for reverse biasing said first and second photodiodes and for subtracting currents flowing through said first and second reverse biased photodiodes comprises a cathode of said first photodiode being electrically connected to an inverting terminal of a first operational amplifier means, a cathode of said second photodiode being electrically connected to an inverting terminal of a second operational amplifier means, and a voltage potential being applied between the anodes of said first and second photodiodes and the noninverting inputs of the first and second operational amplifiers respectively such that the first and second photodiodes are reverse biased, the first and second operational amplifier means having outputs connected to the respective inputs of a subtracting circuit, wherein the output of the subtracting circuit is proportional to the difference in currents flowing through said first and second photodiodes.

6. The light intensity detecting circuit according to claim 1 wherein said photodiodes are fabricated as bulk photodiodes.

7. The light intensity detecting circuit according to claim 6 wherein said reverse bias applied to said photodiodes can be varied so that in operation the spectral response of the photodiodes can be varied.

8. The light intensity detecting circuit according to claim 1 wherein said photodiodes are fabricated as quantum confinement structures.

9. The light intensity detecting circuit according to claim 8 wherein said reverse bias applied to said photodiodes can be varied so that in operation the spectral response of the photodiodes can be varied.

10. The light intensity detecting circuit according to claim 8 wherein said quantum confinement structure comprise quantum wells.

11. The light intensity detecting circuit according to claim 8 wherein said quantum confinement structure comprise quantum wires.

* * * * *